United States Patent [19]

Sakui et al.

[11] Patent Number: 4,798,977
[45] Date of Patent: Jan. 17, 1989

[54] WORD LINE DRIVER FOR USE IN A SEMICONDUCTOR MEMORY

[75] Inventors: Koji Sakui, Tokyo; Shigeyoshi Watanabe, Yokohama, both of Japan

[73] Assignee: Kabushiki Kaisha Toshiba, Kawasaki, Japan

[21] Appl. No.: 130,174

[22] Filed: Dec. 8, 1987

[30] Foreign Application Priority Data

Feb. 26, 1987 [JP] Japan .................... 62-41304

[51] Int. Cl.$^4$ ............... H03K 19/003; H03K 19/01; H03K 17/04; H03K 4/58
[52] U.S. Cl. .................................. 307/446; 307/570; 307/449; 307/463; 307/482
[58] Field of Search ............... 307/475, 264, 446, 570, 307/451, 452, 453, 279, 449, 463, 482, 578; 365/231, 104

[56] References Cited

U.S. PATENT DOCUMENTS

| | | | |
|---|---|---|---|
| 4,713,796 | 12/1987 | Ogiue et al. | 307/446 X |
| 4,716,310 | 12/1987 | Tanizawa et al. | 307/446 |
| 4,719,370 | 1/1988 | Sugimoto | 307/446 |
| 4,719,373 | 1/1988 | Masuda et al. | 307/570 |
| 4,733,110 | 3/1988 | Hara et al. | 307/446 |

FOREIGN PATENT DOCUMENTS 3510948 12/1987 Fed. Rep. of Germany ...... 307/446

61-170992 8/1986 Japan .................... 307/446

*Primary Examiner*—John S. Hetman
*Assistant Examiner*—David R. Bertelson
*Attorney, Agent, or Firm*—Oblon, Fisher, Spivak, McClelland & Maier

[57] ABSTRACT

A word line driver for use in a dRAM. This word line driver comprises one npn bipolar transistor and four n-channel transistors. The bipolar transistor is connected between an "H"-level potential terminal and an output terminal. The first MOS transistor is connected in parallel to the bipolar transistor, and is driven by one output signal of a row decoder to supply an output at a sufficiently high "H" level to word lines. The third MOS transistor is coupled between the base and collector of the bipolar transistor, and its gate is connected to the gate of the first MOS transistor. The third MOS transistor supplies a sufficient base current to the base of the bipolar transistor when the word line driver outputs a potential at the "H" level. The second MOS transistor is coupled between the source of the first MOS transistor and a ground potential terminal, and the fourth MOS transistor is coupled between the source of the third MOS transistor and the ground potential terminal. The other output signal, which is complementary to the one output signal of the row decoder, is supplied to the gates of the second and fourth MOS transistors.

5 Claims, 5 Drawing Sheets

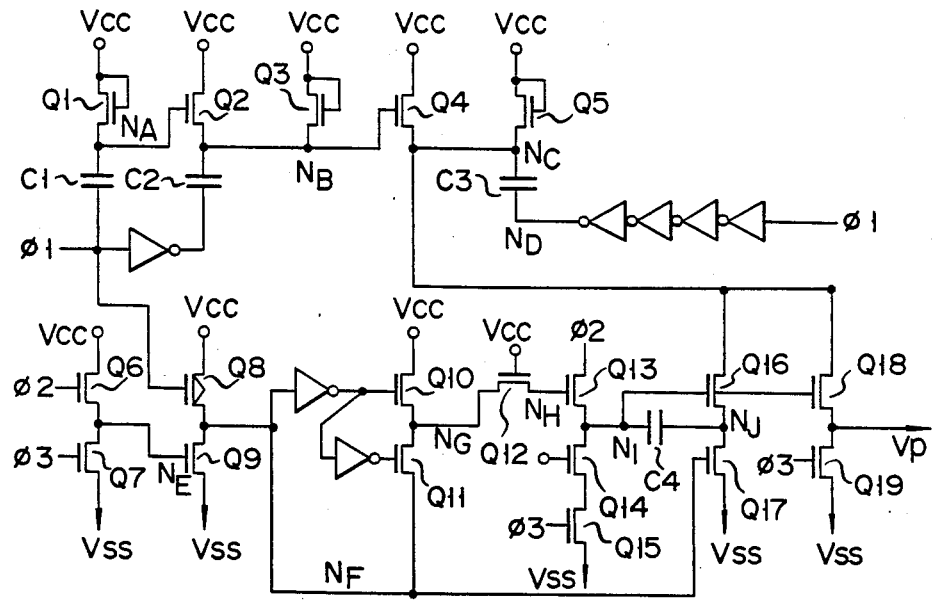
F I G. 2
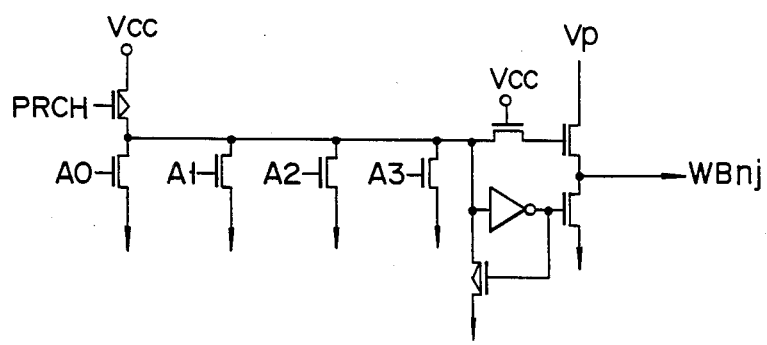
F I G. 3

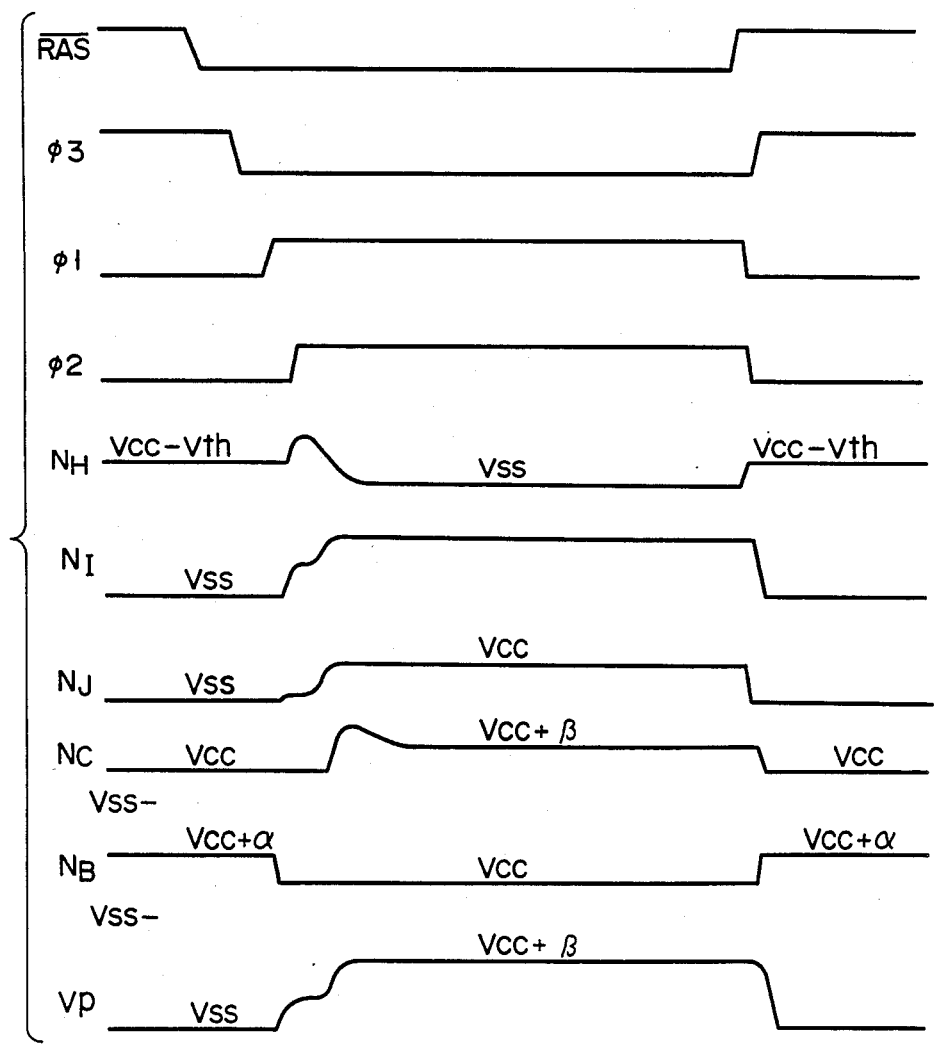
F I G. 4

WORD LINE DRIVER FOR USE IN A SEMICONDUCTOR MEMORY

BACKGROUND OF THE INVENTION

The present invention relates to an inverter, and more particularly, to an inverter which is useful as a word line driver or the like in a dynamic semiconductor memory.

In recent times, the integration density and operation speed of semiconductor memories have both been greatly increased. In particular, there has been a remarkable increase in the integration density and operation speed of dynamic random-access memories (dRAMs) having memory cells each comprising one MOS transistor and one capacitor. The increase in the integration density of dRAMs has been accomplished through a reduction in the size of the elements forming the dRAM, and also through the development of novel memory-cell structures. The recent increase in the operation speed of dRAMs has been achieved through use of BICMOS circuits, each of these being a combination of a CMOS circuit and a number of bipolar transistors. BICMOS circuits are attracting considerable attention in this field, since CMOS circuits consume very little power, and because bipolar transistors operate at high speed.

FIG. 6 is a circuit diagram showing a conventional BICMOS inverter. As is shown in this figure, this inverter comprises a CMOS inverter formed of p-channel MOS transistor Qp11 and n-channel MOS transistor Qn11. The output terminal of this CMOS inverter is coupled to npn transistor T11 which functions as a buffer and is connected to output terminal Vout. Output terminal Vout can be connected to a load. Another npn transistor T12 is connected between output terminal Vout and ground terminal Vss. N-channel MOS transistor Qn12 is coupled between the collector and base of transistor T12. The gate of transistor Qn12 is connected to input terminal Vin. N-channel MOS transistor Qn13 is coupled between the base of transistor T12 and ground terminal Vss. The gate of transistor Qn13 is connected to the base of transistor T11.

When the potential at input terminal Vin is at an "H" level, the output of the CMOS inverter is at an "L" level, and transistor T11 is off. In this case, MOS transistor Qn12 is on, whereas MOS transistor Qn13 is off. Transistor T12 therefore functions as a diode. As a result, the potential at output terminal Vout is maintained at the "L" level.

When the potential at input terminal Vin is at the "L" level, the output of the CMOS inverter rises to the "H" level, and transistor T11 is turned on. As a result, MOS transistors Qn12 and Qn13 are turned off and on, respectively, and hence, transistor T12 is turned off. The potential at output terminal Vout is thereby raised to the "H" level.

The BICMOS inverter described above has bipolar transistors in the output section. Since bipolar transistors have a greater driving ability than MOS transistors, the BICMOS inverter can operate at high speed when it is used as a drive circuit for driving loads having large capacitance, and thus it can be incorporated into the peripheral circuits of a semiconductor memory. However, when the BICMOS inverter is used as the word line driver in a dRAM, a number of problems arise. One is that the BICMOS inverter cannot generate a sufficiently high "H" level output, due to the forward voltage drop $V_{BE}$ between the base and emitter of the bipolar transistors, as is illustrated in FIG. 7. This is because transistor T11 is inevitably turned off when the potential at output terminal Vout is equal to or higher than $V_{cc} - V_{BE}$. When a voltage of this insufficient "H" level is applied to word line WL connected to the dRAM cell shown in FIG. 8, which consists of MOS transistor $Q_M$ and capacitor $C_M$, the "H" level voltage applied to and held in capacitor $C_M$ is $V_{cc} - V_{BE} - V_{th}$, where Vth is the threshold voltage of MOS transistor $Q_M$. When Vcc is 5V, VBE is 0.6V, and Vth is 1.2V, the "H" level voltage will be 3.2V, which is 64% of power-supply voltage Vcc.

Another problem inherent in the BICMOS inverter described above is that its use in a semiconductor memory will work against the high integration of the memory, because of the use of bipolar transistors, which take up a large area of the circuit. In the case of, for example, a 16M bit dRAM which will be more commonly used in the future, the word lines are arranged at extremely short intervals of 2 to 3 nm. The BICMOS inverter, which comprises one CMOS circuit and several bipolar transistors, is too large to be arranged between the adjacent word lines of the 16M bit dRAM.

As has been already mentioned, when the conventional BICMOS inverter is used as the word line driver in a dRAM, a sufficiently high "H" level voltage cannot be provided, and the high integration of the dRAM will not be possible to the degree desired.

SUMMARY OF THE INVENTION

The object of the present invention is to provide an inverter which can operate at high speed and can generate an output at a sufficiently high level.

Another object of the invention is to provide a word line driver for use in a dRAM, which can operate at high speed and can also generate an output at a sufficiently high level, and can thus produce a sufficiently high written data voltage.

An inverter according to this invention comprises one npn bipolar transistor and four n-channel MOS transistors. The gate of the first MOS transistor is connected to a first input terminal, and its source is coupled to an output terminal. A potential at an "H" level is applied to the drain of the first MOS transistor. The gate of the second MOS transistor is coupled to a second input terminal, to which an input signal complementary to the signal input to the first input terminal is supplied. The drain of the second MOS transistor is connected to the output terminal. A potential at an "L" level is applied to the source of the second MOS transistor, and the "H" level potential is applied to the collector of the bipolar transistor. The emitter of the bipolar transistor is connected to the output terminal. The third MOS transistor is connected between the collector and base of the bipolar transistor. The gate of the third MOS transistor is coupled to the first input terminal. The fourth MOS transistor is connected between the base and emitter of the bipolar transistor. The gate of the fourth MOS transistor is coupled to the second input terminal.

When the potentials at the first and second input terminals are at the "L" level and the "H" level, respectively, the first and third MOS transistors and the bipolar transistor are off, whereas the second and fourth MOS transistors are on. In this condition, the potential at the output terminal is maintained at the "L" level. When the potentials at the first and second input terminals are at the "H" level and the "L" level, respectively, the first and third MOS transistors and the bipolar transistor are on, whereas the second and fourth MOS transistors are off. As a result, the potential at the output terminal is at the "H" level.

When the potential at the output terminal rises to the "H" level, the bipolar transistor is driven by the third MOS transistor which is deeply on due to the capacitance coupling the gate and source of the third MOS transistor. Therefore, the output of the bipolar transistor quickly rises to the "H" level. The "H" level potential obtained by the inverter is not influenced by the forward voltage drop between the base and emitter of the bipolar transistor, and is equal to the "H" level potential applied to the collector of the bipolar transistor. This is because the first MOS transistor, which is connected in parallel to the bipolar transistor, is deeply turned on, due to the capacitance coupling the gate and source. Therefore, when this inverter is incorporated into a dRAM and used as a word line driver, not only can it drive the word lines of the dRAM at high speed, it can also apply a sufficiently high "H" level voltage to the word lines thereof. Since the inverter has only one bipolar transistor, it is then small enough to be located between the adjacent word lines of a dRAM of high integration density. In this case, therefore, it is possible to design the most advantageous pattern for a word line driver used in a dRAM, without comprising the high integration density of the dRAM.

BRIEF DESCRIPTION OF THE DRAWINGS

FIG. 2 is a circuit diagram showing a booster circuit for applying a boosted voltage to the word line driver of the dRAM;

FIG. 3 is a circuit diagram showing the predecoder used in the dRAM shown in FIG. 1;

FIG. 4 is a timing chart explaining the operation of the booster circuit shown in FIG. 2;

DETAILED DESCRIPTION OF THE PREFERRED EMBODIMENT

Figure 1:
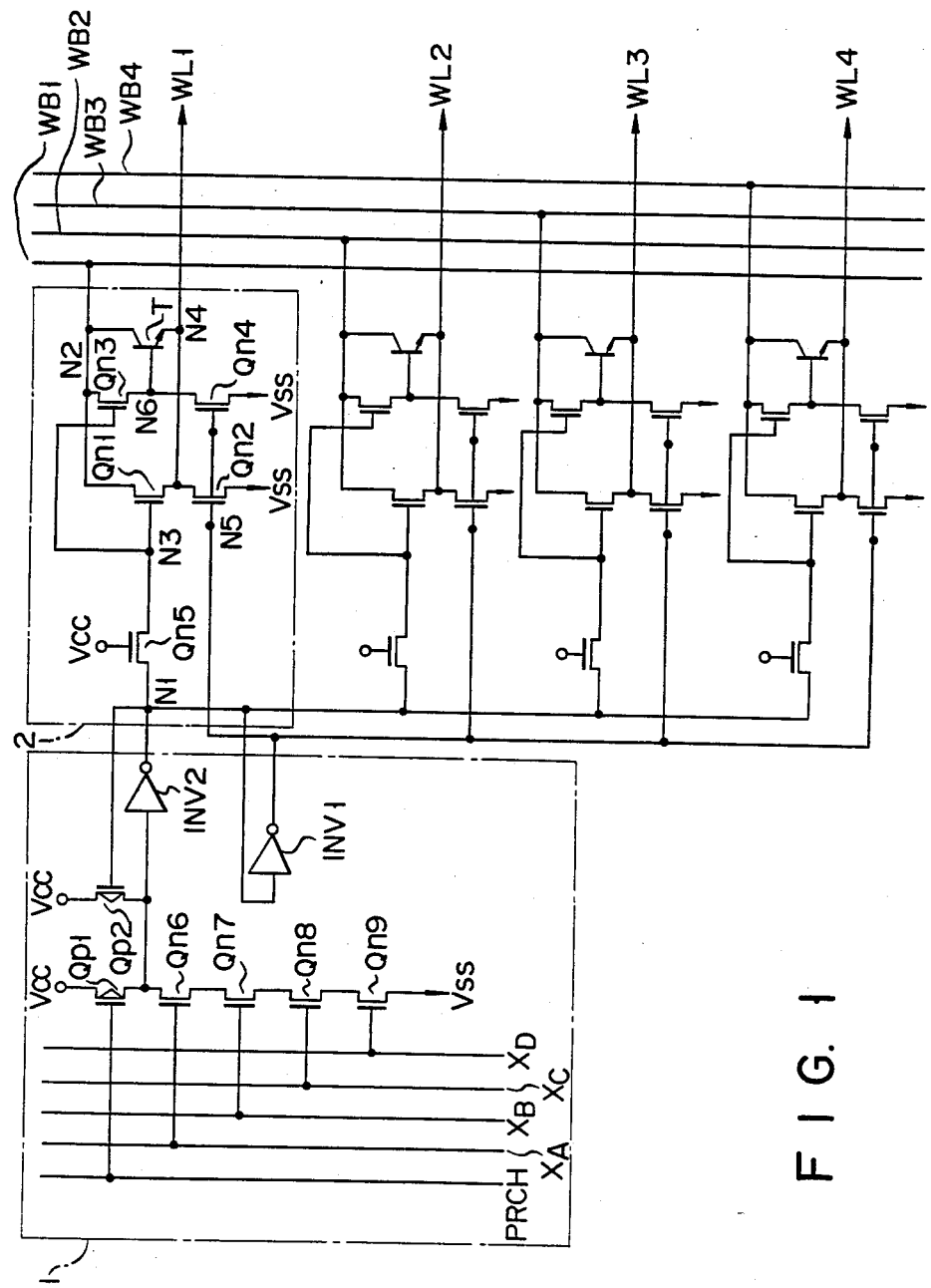
FIG. 1 is a circuit diagram showing the major sections of a dRAM provided with an inverter according to the present invention, which is used as a word line driver.

FIG. 1 shows circuit equivalent to row decoder 1 and word line driver 2 of a dRAM. Word line driver 2 comprises a number of units for driving word lines WL1, WL2, WL3, WL4, ..., respectively. Each of these units comprises first to fourth n-channel MOS transistors Qn1 to Qn4, and one npn transistor T. The drains of first and third MOS transistors Qn1 and Qn3, and the collector of npn transistor T are connected together at node N2. A potential at an "H" level is selectively applied to node N2. The "H" level potential applied to node N2 has been obtained by boosting a power-supply potential by means of a booster circuit (later described). It is applied to node N2 through signal line WB1 selected by a predecoder (later described). (Signal lines WB2, WB3, WB4, ... are connected to nodes N2 of the other units forming word line driver 2.)

The gates of first and third MOS transistors Qn1 and Qn3 are connected at node N3 which functions as a first input terminal. Node N3 is coupled to one of the two output nodes of row decoder 1, i.e., node N1, by a fifth n-channel MOS transistor Qn5. The source of first MOS transistor Qn1 and the emitter of npn transistor T are connected at node N4 which functions as an output terminal. Output terminal N4 is connected to word line WL1. The gates of second and fourth MOS transistors Qn2 and Qn4 are coupled at node N5 which functions as a second input terminal. Node N5 is connected to the other output node of row decoder 1, which supplies an output complementary to the output supplied from output node N1. A potential at a "L" level (i.e., ground potential Vss) is applied to the sources of second and fourth MOS transistors Qn2 and Qn4.

FIG. 2 shows the booster circuit for generating the "H" level potential. FIG. 3 illustrates the predecoder for applying the "H" level potential to word driver 2.

The booster circuit of FIG. 2 is a clock generating circuit which is controlled by clock signals $\phi 1$ to $\phi 2$ produced in synchronism with signal $\overline{RAS}$, thereby to output boosted potential Vp. The booster circuit comprises several MOS transistors, of which only transistor Q8 is a p-channel MOS transistor, all the others being n-channel MOS transistors. For the sake of simplicity, it is assumed that all n-channel MOS transistors have the same threshold voltage Vth. This booster circuit operates as is illustrated in the timing chart of FIG. 4. Clock signal $\phi 3$ is a reset signal, and falls to the "L" level when signal $\overline{RAS}$ falls from the "H" level to the "L" level. Clock signal $\phi 1$ is a precharge signal and remains at the "L" level as long as signal $\overline{RAS}$ is at the "H" level. P-channel MOS transistor Q8 is on while signal $\overline{RAS}$ remains at the "H" level. Node $N_F$ is precharged to power-supply voltage Vcc by this MOS transistor Q8. When node $N_F$ is precharged to the power-supply voltage Vcc, nodes $N_A$, $N_G$ and $N_H$ are precharged to to Vcc−Vth, and node B is precharged to Vcc+$\alpha$. Value of $\alpha$ is determined by the ratio of the capacitance of capacitor C2 to the capacitance of node $N_B$. During the precharging period, node $N_C$ is maintained at powersupply voltage Vcc, and nodes $N_D$, $N_I$ and $N_J$ are maintained at ground potential Vss. After clock signal $\phi 3$ has risen to the "H" level, clocks $\phi 1$ and $\phi 2$ rises from the "L" level to the "H" level, sequentially. The potential at node $N_I$ is therefore boosted to a value greater than power-supply voltage Vcc by means of capacitor C4. As result, MOS transistor Q18 provided in the output stage is biased to operated in a triode-operating region, whereby boosted potential $V_p$ is generated. Potential $V_p$ is: Vcc+$\beta$ where $\beta$ is determined by bootstrap capacitance C3 and the capacitance $C_{WL}$ of the selected word line which is the load of the booster circuit. $\beta$ is given as:

$$\beta = (Vcc - Vss) C3/(C3 + C_{WL})$$

Usually, bootstrap capacitance C3 is set at such a value that $C3/(C3+C_{WL})$ becomes 0.5 or greater.

FIG. 3 shows a predecoder which receives precharge signal PRCH. When signal $\overline{RAS}$ falls from the "H" level to the "L" level, precharge signal PRCH rises from the "L" level to the "H" level. When address bits A0, A1, A2 and A3 are input to the predecoder after precharge signal has risen to the "H" level, signal line $W_{Bnj}$ is selected.

Figure 5:
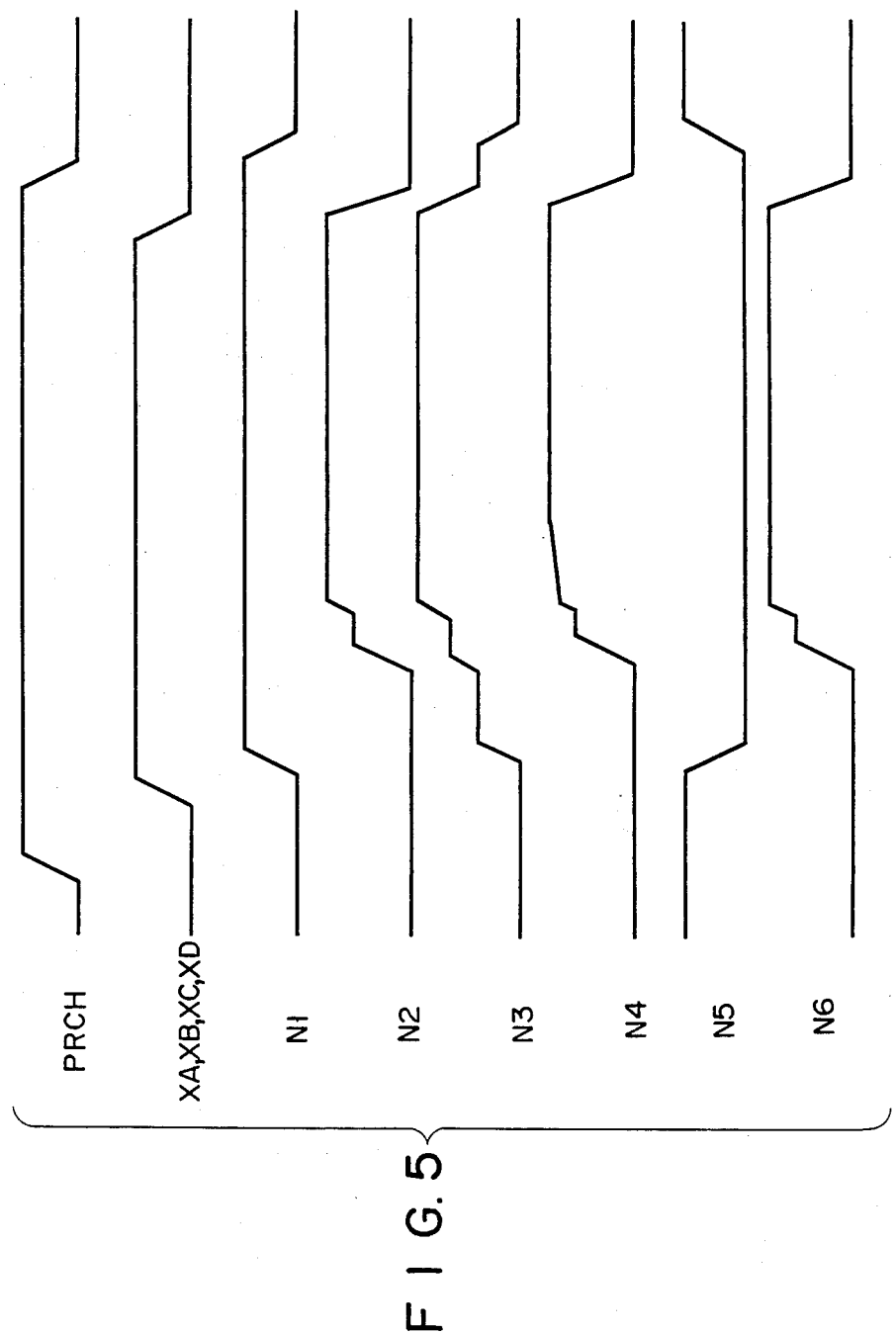
FIG. 5 is a timing chart explaining the operation of the word line driver.
Figure 6:
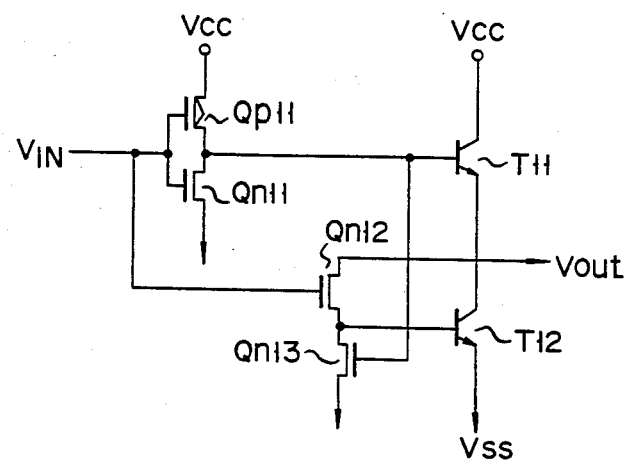
FIG. 6 is a circuit diagram illustrating a conventional BICMOS inverter.
Figure 7:
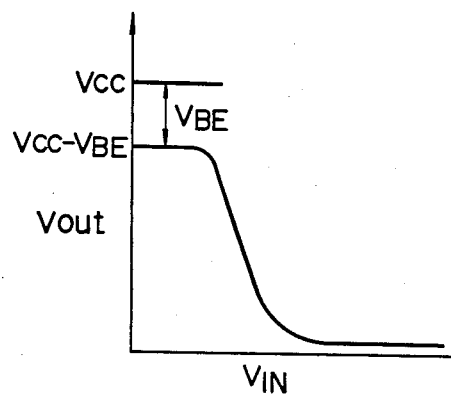
FIG. 7 is a graph showing the input-output characteristic of the conventional BICMOS inverter.
Figure 8:
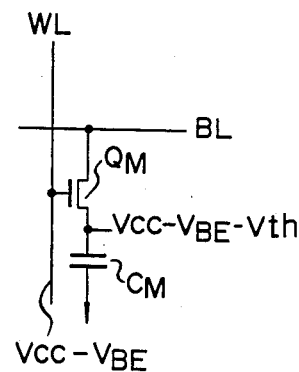
FIG. 8 is a diagram illustrating a dRAM cell.

The operation of the word driver shown in FIG. 1 will now be explained with reference to FIG. 5. In row decoder 1, p-channel MOS transistor Qp1 is on when precharge signal PRCH is at the "L" level. In this condition, the drain of MOS transistor Qp1, which is connected to n-channel MOS transistors Qn6 to Qn9 are precharged to internal power-supply voltage Vcc. MOS transistors Qn6 to Qn9 are connected in series and function as gates. When precharge signal PRCH rises from the "L" level to the "H" level, row decoder 1 comes into an operable condition. When a row address is input, signals XA, XB, XC and XD are supplied form an address buffer (not shown) and the predecoder. When all these signals XA, XB, XC and XD are at the "H" level, decoder 1 is selected. Signals XA, XB, XC and XD are supplied to the gates of n-channel MOS transistors Qn6, Qn7, Qn8 and Qn9, respectively, thereby turning on these MOS transistors. Inverter INV2 outputs a "H" level signal to node N1. At the same time, this "H" level signal is inverted by inverter INV1 into an "L" level signal. This "L" level signal is supplied to node N5. The "H" level signal supplied to node N1 is supplied to node N3 via n-channel MOS transistor Qn5 which functions as a transfer gate. The potential at node N3 changes to Vcc−Vth, where Vth is the threshold voltage of all n-channel MOS transistors. As a result, first and third MOS transistors Qn1 and Qn3 are turned on, whereas second and fourth MOS transistors Qn2 and Qn4 are turned off.

When boosted potential $V_p$, which is the output of the booster circuit shown in FIG. 2, is selected by the predecoder of FIG. 3 and is supplied to signal line WB1, the potential at node N3 rises from Vcc−Vth to a value nearly equal to Vcc−Vth+$V_p$, due to the coupling occurring when first and second MOS transistors Qn1 and Qn3 are turned on. Fifth MOS transistor Qn5 is turned off at this time. A base current is supplied to bipolar transistor T through third MOS transistor Qn3, whereby bipolar transistor T is turned on. Boosted potential $V_p$ is applied to selected word line WL1 through bipolar transistor T and first MOS transistor Qn1, both being on. Word line WL1 is thereby charged quickly. When the potential of this word line WL1 rises to $V_p - V_{BE}$, bipolar transistor T is turned off. ($V_{BE}$ is the forward voltage drop between the base and emitter of bipolar transistor T.) First MOS transistor Qn1 remains on even after bipolar transistor T has been turned off. Further, first MOS transistor Qn1 is biased in the triode operation region. Therefore, first MOS transistor Qn1 is on, virtually with no voltage drop occurring between its drain and source. Hence, word line WL1 is charged to almost boosted potential $V_p$ through first MOS transistor Qn1, whereby word line WL1 is completely selected.

As has been described, an selected word line can be driven to have its potential raised to a sufficiently high "H" level, by means of first MOS transistor Qn1. Therefore, a sufficiently high written data voltage can be applied to any dRAM cell (i.e., a combination of one MOS transistor and one capacitor) which is coupled to the selected word line. This is because the written data voltage is not adversely influenced by the forward voltage-drop between the base and emitter of the bipolar transistor, as in the conventional BICMOS inverter. The application of the sufficiently high written data voltage to the dRAM cells can improve the noise margin, can reduce the possibility of software errors, and can help to increase the reliability of dRAMs. In addition, one bipolar transistor is provided in the output stage of the word line driver, and the base of this bipolar transistor is driven by third MOS transistor Qn3 which is biased in a deep on-state. Therefore, the bipolar transistor can quickly drive the word lines of a dRAM. Further, since the word line driver has only one bipolar transistor, it can be formed in the narrow space between the adjacent word lines of the dRAM. Still further, since all the MOS transistors used in the word line driver are of n-channel type, well-separation is unnecessary in manufacturing a dRAM containing this word line driver, unlike in manufacturing a dRAM containing the conventional BICMOS inverter used as a word line driver.

The present invention is not limited to the embodiment described above. The embodiment is designed for use in a dRAM. However, the inverter circuit of this invention can be used in a static RAM, in which case the advantages pointed out in the preceding paragraph can also be attained. Moreover, the inverter circuit of this invention can be used as a driver circuit in various semiconductor IC circuits other than semiconductor memories.

As has been described, the inverter circuit according to the present invention comprises one npn transistor and four n-channel MOS transistors. It can operate at high speed, can also generate an output signal at a sufficiently high level. Moreover, it can be provided in the narrow space, and can therefore be incorporated, as a word line driver, into a dRAM of a high integration density.

What is claimed is

1. An inverter comprising:
   a first n-channel MOS transistor whose drain is connected to receive a potential at an "H" level, whose source is connected to an output terminal, and whose gate is used as a first input terminal;
   a second n-channel MOS transistor whose drain is connected to said output terminal, whose source is connected to receive a potential at an "L" level, and whose gate is used as a second input terminal, for receiving an input signal which is complementary to an input signal supplied to said first input terminal;
   an npn transistor whose collector is connected to the drain of said first n-channel MOS transistor, and whose emitter is connected to said output terminal;
   a third n-channel MOS transistor whose drain is connected to the collector of said npn transistor, whose source is connected to the base of said npn transistor, and whose gate is connected to said first input terminal; and
   a fourth n-channel MOS transistor whose drain is connected to the base of said npn transistor, whose source is connected to receive a potential at the "L" level, and whose gate is connected to said second input terminal.

2. The inverter according to claim 1, wherein said potential at the "H" level is a boosted potential, and said potential at the "L" level is ground potential.

3. A word line driver for use in a semiconductor memory, comprising:
   a first n-channel MOS transistor whose drain is connected to receive a potential at an "H" level, whose source is connected to an output terminal, to be coupled to a word line, and whose gate is used as a first input terminal, to receive one output signal of a row decoder;

a second n-channel MOS transistor whose drain is connected to said output terminal, whose source is connected to receive a potential at an "L" level; and whose gate is used as a second input terminal, for receiving the other output signal, which is complementary to said one output signal of said row decoder;

an npn transistor whose collector is connected to the drain of said first n-channel MOS transistor, and whose emitter is connected to said output terminal;

a third n-channel MOS transistor whose drain is connected to the collector of said npn transistor, whose source is connected to the base of said npn transistor, and whose gate is connected to said first input terminal; and a fourth n-channel MOS transistor whose drain is connected to the base of said npn transistor, whose source is connected to said potential at the "L" level, and whose gate is connected to said second input terminal.

4. The word line driver according to claim 3, wherein said potential at the "H" level is a boosted potential, and said potential at the "L" level is ground potential.

5. The word line driver according to claim 3, further comprising a fifth n-channel MOS transistor connected between the output terminal of said row decoder and said first input terminal, and used as a transfer gate.

* * * * *